(12) United States Patent
Hirota et al.

(10) Patent No.: US 7,054,157 B2
(45) Date of Patent: May 30, 2006

(54) FREQUENCY CONVERTER

(75) Inventors: Masayuki Hirota, Narashino (JP); Mingxi Huang, Narashino (JP); Satoshi Ibori, Yachimata (JP); Yutaka Maeno, Yotsukaido (JP)

(73) Assignee: Hitachi Industrial Equipment Systems Co., Ltd., Chiba (JP)

( * ) Notice: Subject to any disclaimer, the term of this patent is extended or adjusted under 35 U.S.C. 154(b) by 108 days.

(21) Appl. No.: 10/894,053

(22) Filed: Jul. 20, 2004

(65) Prior Publication Data

US 2005/0030715 A1  Feb. 10, 2005

(30) Foreign Application Priority Data

Jul. 28, 2003  (JP) .............................. 2003-202157

(51) Int. Cl.
*H05K 7/20* (2006.01)

(52) U.S. Cl. ...................... 361/695; 361/690; 361/697; 174/16.1; 174/16.3; 165/80.3; 454/184

(58) Field of Classification Search ................ 361/695, 361/697, 719, 721; 174/16.1, 16.3; 165/80.3; 454/184
See application file for complete search history.

(56) References Cited

U.S. PATENT DOCUMENTS

| | | | | |
|---|---|---|---|---|
| 4,035,711 A | * | 7/1977 | Piller | ........................... 363/174 |
| 4,237,521 A | * | 12/1980 | Denker | ........................ 361/697 |
| 5,424,915 A | * | 6/1995 | Katooka et al. | ............. 361/695 |
| 6,477,053 B1 | * | 11/2002 | Zeidan et al. | ................ 361/719 |
| 6,621,700 B1 | * | 9/2003 | Roman et al. | .............. 361/697 |
| 6,909,602 B1 | * | 6/2005 | Dietrich et al. | ............. 361/687 |

FOREIGN PATENT DOCUMENTS

JP  7-95771  4/1995

\* cited by examiner

*Primary Examiner*—Boris Chervinsky
(74) *Attorney, Agent, or Firm*—Antonelli, Terry, Stout and Kraus, LLP.

(57) ABSTRACT

Measures are provided to prevent temperature rise caused by that heat generated from power elements, which is radiated inside a housing.

In a housing comprising a radiating section and a cooling fan, a guide is provided on a part of the housing to be made longer a predetermined value than the radiating section. When the cooling fan performs forced cooling through the guide, gases heated by a substrate that generates much heat are prevented from flowing onto a substrate that generates comparatively less heat, to heat the substrate that generates comparatively less heat. Therefore, for example, the substrate that generates much heat is arranged in a position nearer to the cooling fan than the substrate that generates comparatively less heat. Alternatively, the substrate that generates much heat is arranged in a position nearer to the intake face than the substrate that generates comparatively less heat. By providing the guide on the housing, an existing fan can radiate heat from the substrate that generates much heat, the substrate that generates comparatively less heat, etc., thereby enabling reduction in temperature rise.

10 Claims, 7 Drawing Sheets

UPWARD

FIG. 7

| POINT OF MEASUREMENT | CONVENTIONAL DEVICE | EMBODIMENT |
|---|---|---|
| MCU | 31.4°C | 16.5°C |
| ON SEALING MATERIAL (ON RESIN) | 53.7°C | 44.2°C |
| ON RADIATING SECTION | 38.6°C | 38.2°C |

UPWARD
←

FREQUENCY CONVERTER

BACKGROUND OF THE INVENTION

The present invention relates to a technique that provides a frequency converter to supply electric power to, for example, a motor, etc.

In a frequency converter, a power element semiconductor device comprising IGBT, diode, etc. to perform frequency conversion ordinarily generates a large quantity of heat, and thus performs forced cooling making use of suction and exhaust with a fan to radiate heat from a radiating section.

In some cases, however, heat cannot be adequately radiated from the radiating section by means of the fan, so that temperature inside a housing rises to cause temperature rise in other elements than the power element semiconductor device.

In particular, since a semiconductor device, such as CPU, etc., for control has a low temperature for guarantee of normal performance (the temperature is referred below to as performance guaranteed temperature) as compared with a power element semiconductor, etc., it is shortened in service life when reaching a high temperature and it cannot in some cases perform control normally due to thermal runaway that accompanies temperature rise, or the like.

It is generally said that semiconductor devices are broken when temperature exceeds about 150° C., and a contrivance for efficient radiation of heat is effected on semiconductor devices such as CPU, etc., which is disclosed in, for example, JP-A-7-95771.

JP-A-7-95771 discloses techniques, in which other products used at low temperatures, than semiconductor devices for electric power are taken the heat from by a cooling action of a cooling fan for cooling of semiconductor devices for electric power.

SUMMARY OF THE INVENTION

With the techniques described in JP-A-7-95771, however, other products used at low temperatures, than semiconductor devices for electric power and power element semiconductors, and CPU, etc. are also forcedly cooled by a cooling fan but an entire device becomes complicated in construction and the device itself is made large in size. For example, semiconductor devices for electric power and products used at low temperatures are separately arranged in a housing by means of a partition and spaces for the provision of air flow passages for forced cooling of the semiconductor devices and the products are provided, so that the device is made large in size.

Accordingly, it is an object of the invention to radiate heat from a device and inside a housing while taking account of miniaturization of the device.

The invention attains the object in the following manner.

Arranged in the same housing are elements and substrates, etc. that generate much heat, and elements and substrates, etc. that generate less heat.

Semiconductor devices, modules, or substrates that generate much heat, and semiconductor devices, modules, or substrates that generate less heat, are arranged in the same housing to thereby achieve miniaturization of an entire device. Also, semiconductor devices, modules, or substrates that generate much heat, and semiconductor devices, modules, or substrates that generate less heat, are provided to separate substrates to thereby prevent heat conduction from a side that generates much heat, to a side that generates comparatively less heat.

Also, a guide is provided on the housing to generate gas flows to have elements; substrates, etc. that generate much heat to radiate heat, and elements, substrates, etc. that generate less heat.

A guide is provided on the housing to direct even gases around substrates that generate much heat, and substrates that generate less heat, etc. toward a face (referred below to as intake face), through which a radiating section sucks gases. Gases around substrates that generate much heat, and substrates that generate comparatively less heat are also caused by the guide to be exhausted from a face (referred below to as exhaust face), through which gases having been passed through the radiating section by virtue of an action of a fan are exhausted, and to radiate heat.

Also, gases from around substrates that generate much heat are prevented from flowing onto substrates that generate comparatively less heat.

When the fan performs forced cooling with the guide, gases heated by substrates that generate much heat are prevented from flowing toward substrates that generate comparatively less heat, to warm the substrates that generate comparatively less heat. Therefore, for example, substrates that generate much heat are arranged in positions nearer to the fan than substrates that generate comparatively less heat. Alternatively, substrates that generate much heat are arranged in positions nearer to the intake face than substrates that generate comparatively less heat.

By providing the guide on the housing, an existing fan can exhaust gases around substrates that generate much heat, substrates that generate comparatively less heat, etc. to have them to radiate heat even without the provision of a new fan for radiation of heat, thereby enabling reduction in temperature rise.

Other objects, features and advantages of the invention will become apparent from the following description of the embodiments of the invention taken in conjunction with the accompanying drawings.

BRIEF DESCRIPTION OF THE DRAWINGS

FIG. 7 is a table of a comparison made between a conventional device and a device according to the invention.

DESCRIPTION OF THE PREFERRED EMBODIMENTS

Figure 1:
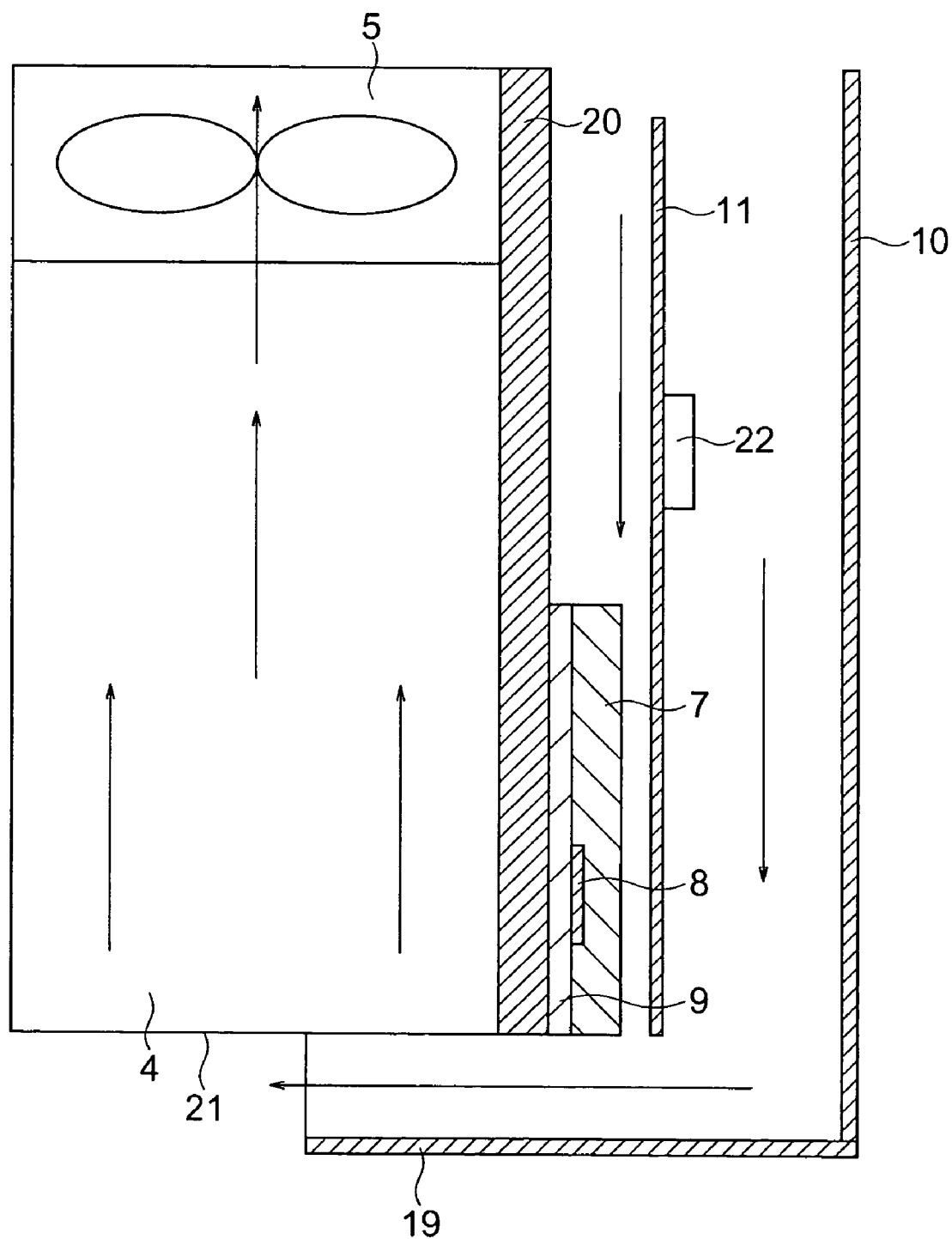
FIG. 1 is a conceptual view showing an embodiment of the invention.
Figure 2:
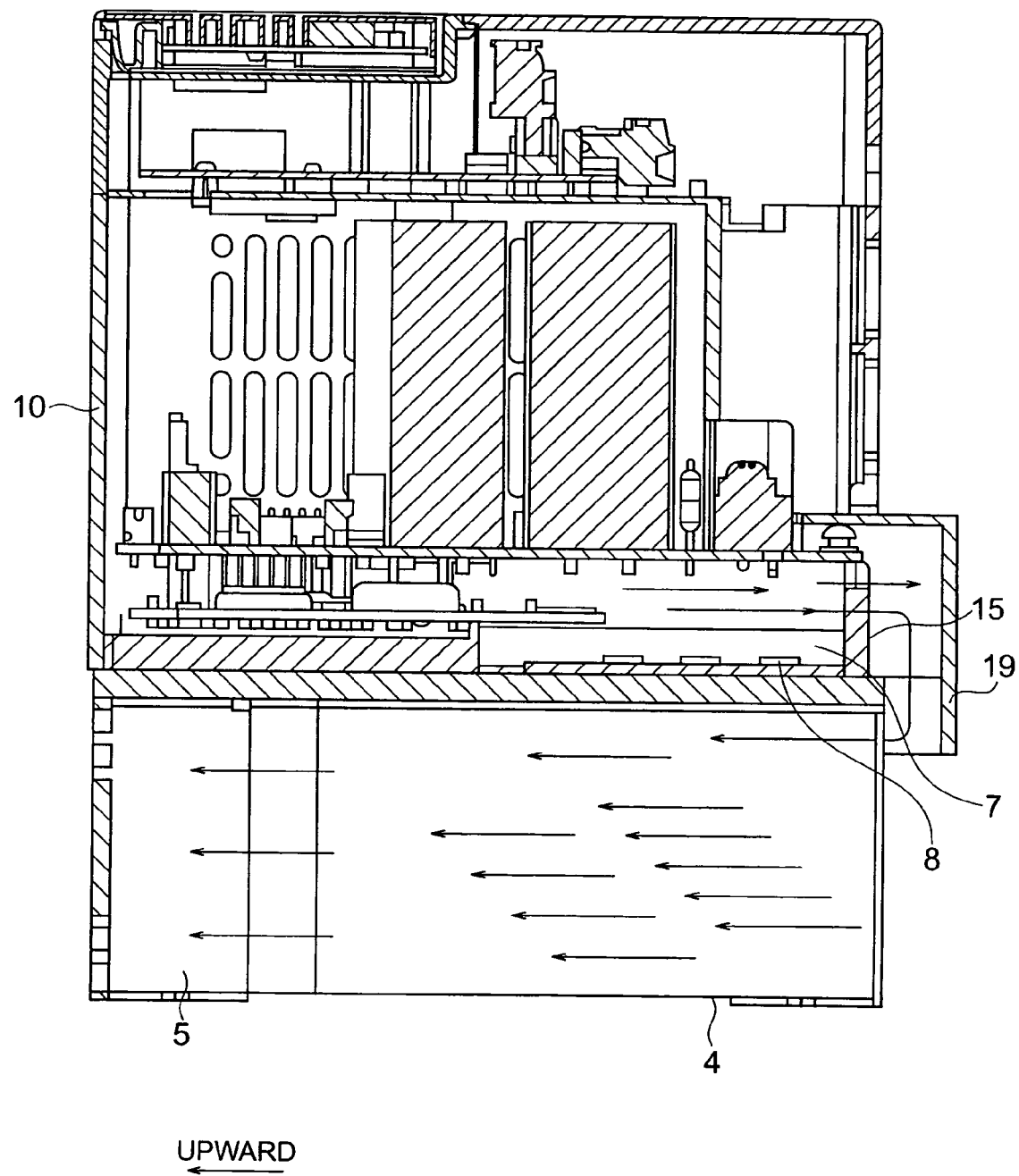
FIG. 2 is a view showing the embodiment of the invention (a view as viewed from laterally)

FIG. 1 is a conceptual view showing an embodiment of the invention, the conceptual view being a side view showing a state, in which a frequency converter is mounted on a mount surface of a wall of an installation, or the like, as viewed from laterally. Also, FIG. 2 is a side view showing the embodiment in the case where it is applied to a product (however, a left direction in FIG. 2 corresponds to an upward direction in case of actual mounting).

In FIG. 1, a frequency converter comprises a radiating section 4, a cooling fan 5, a sealing material 7, a power element semiconductor 8 such as IGBT, diode, etc., a metallic substrate 9, a casing (generally called a housing) 10 of the device, a substrate 11 built in the device, a base 20 of the radiating section 4, fins 21 used for heat radiation of the radiating section 4, and a semiconductor 22 such as MCU (called Micro Controller Unit and including a semiconductor chip of CPU, etc.). Generally, the power element semiconductor 8 corresponds to a semiconductor element and a substrate, which generate much heat, the semiconductor 22 such as MCU corresponds to a semiconductor device and a substrate, which generate relatively less heat, and an explanation will be given on the basis of the above.

The housing 10 is provided with a guide 19 to enable taking in an air that generates an air flow passing over the power element semiconductor 8 to cool heat generated from the power element semiconductor 8.

Figure 3:
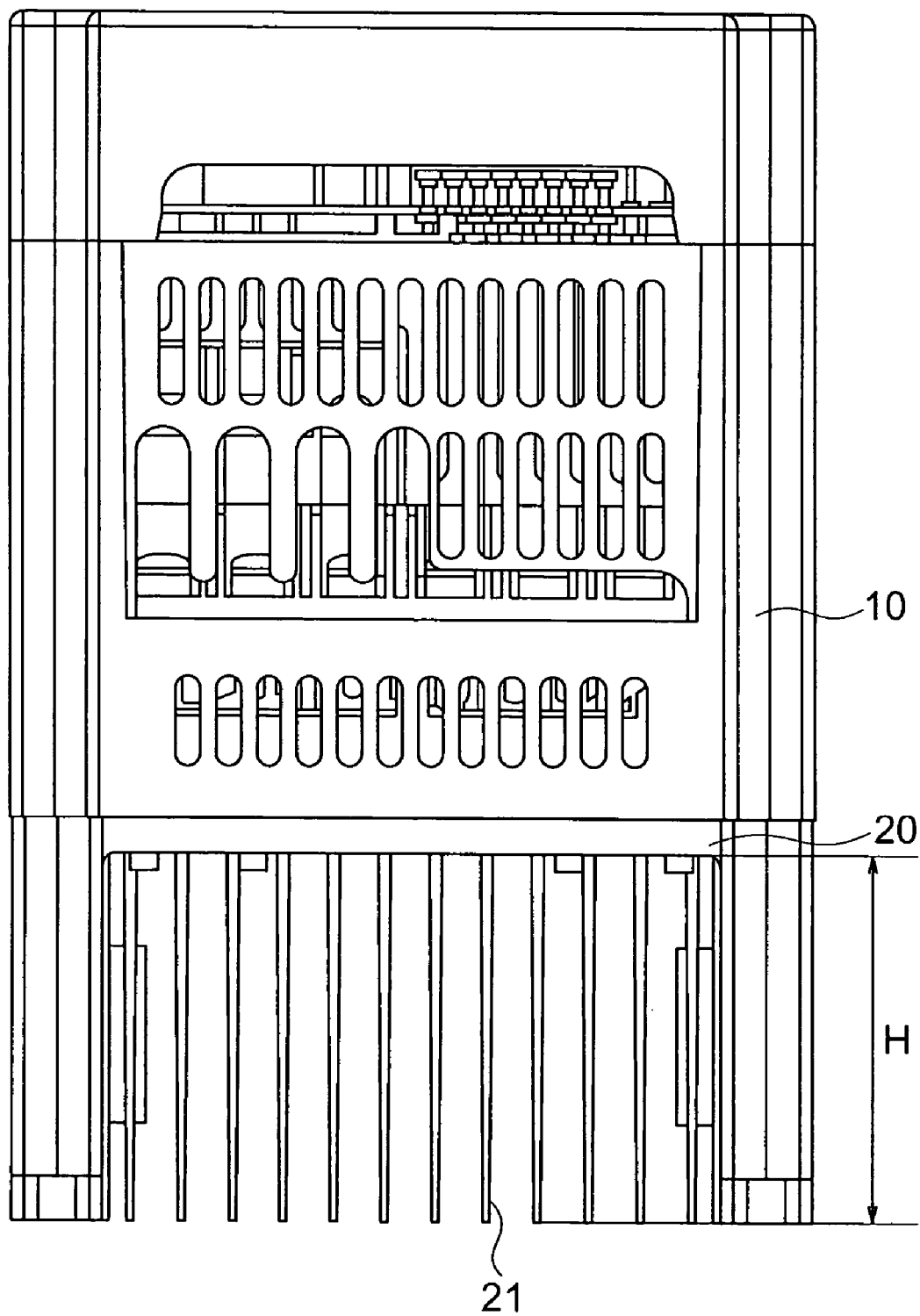
FIG. 3 is a view showing the embodiment of the invention (a view as viewed in a direction along a depth)

First, the radiating section 4 is composed of the base 20 and the fins 21 (FIG. 3 is a view showing the constitution as viewed from a different angle). The base 20 is that portion, to which heat is conducted from a heating element, and the fins 21 receives heat conducted from the base 20 to transfer heat to an air in the surrounding atmosphere to radiate heat.

Next, the power element semiconductor 8 such as IGBT, diode, etc. is mounted on the metallic substrate 9, and generally sealed by the sealing material 7 (also called a resin material).

With the frequency converter, a major part of heat generated in the power element semiconductor 8 such as IGBT, diode, etc. due to loss in conversion is conducted to the base 20 of the radiating section 4.

In the radiating section 4, gases, such as an air in the surrounding atmosphere, sucked from an intake face shown in FIG. 1 are exhausted to the surrounding atmosphere by the cooling fan 5 provided on an exhaust face. When gases such as the sucked air or the like pass through the fins 21, heat conducted to the fins 21 in the radiating section 4 is removed of by the sucked gases to be exhausted to the surrounding atmosphere whereby heat is radiated from the radiating section 4.

Meanwhile, the guide 19 provided on the housing 10 as shown in FIG. 1 makes use of a part of wind arisen from the cooling fan 5 to forcedly cool heat emitted toward an interior of the housing from the power element semiconductor 8, etc.

The embodiment achieves miniaturization of the device by arranging the substrate, which includes the power element semiconductor 8, and the substrate, which includes the semiconductor 22 such as MCU, etc. in the same housing as shown in FIG. 1.

Since the power element semiconductor 8 generates a considerable quantity of heat, however, heating is effected when gases heated by the power element semiconductor 8 flows onto the substrate, which includes the semiconductor 22 such as MCU, etc., at the time of the forced cooling, with the result that the semiconductor 22 such as MCU, etc., is raised in temperature.

Accordingly, the substrate, which includes the power element semiconductor 8, is arranged in an acceptable mount range to be separated from the substrate, which includes the semiconductor 22 such as MCU, etc. Besides, the substrate, which includes the power element semiconductor 8, is positioned on a so-called lee of a gas flow at the time of the forced cooling, relative to the substrate, which includes the semiconductor 22 such as MCU, etc. Therefore, as shown in FIG. 1, the substrate, which includes the power element semiconductor 8, is arranged in a position nearer to the intake face of the radiating section 4 than the substrate, which includes the semiconductor 22 such as MCU, etc.

Owing to such arrangement, gases heated by the power element semiconductor 8 flow onto the substrate, which includes the semiconductor 22 such as MCU, etc. to prevent temperature rise.

In addition, the arrangement is not limited to positions of the respective substrates but may be contrived so that the power element semiconductor 8 itself be arranged in a position near to the intake face.

Next, FIG. 3 is a view showing the radiating section 4 as viewed in a direction along a depth of a product.

As shown in FIG. 3, the radiating section 4 comprises the base 20 and the fins 21, and gases sucked from the intake face pass through the fins 21.

In addition, a height H of the radiating section 4 described later corresponds to a length up to a position, in which the fins 21 are mounted to the base 20 as shown in FIG. 3.

Here, FIG. 4 indicates results of examination by simulation with respect to a length of an extent, over which the radiating section and the guide overlaps one another in the embodiment shown in FIG. 1. FIG. 4 indicates temperatures of the radiating section 4, temperatures of the sealing material 7, and temperatures of MCU 22 (including a semiconductor chip of CPU, etc.). In addition, since the power element semiconductor 8 is sealed by the sealing material 7, temperatures as measured correspond to temperatures of the sealing material 7. Therefore, an explanation will be given using temperatures of the sealing material 7 in place of temperature of the power element semiconductor 8.

First, conditions of simulation in FIG. 4($a$) are as follows.

(a) An ambient temperature is 35° C.

(b) Simulation temperatures correspond to temperature of the radiating section 4, temperatures of the sealing material 7, and temperatures of MCU 22.

(c) A magnitude of a gap between the radiating section and the guide is made constant to amount to 10 mm.

(d) Simulation is carried out varying a length of an extent, over which the radiating section and the guide overlap each other.

(e) A cooling fan as used is of a type generally called a large air volume type.

In FIG. 4($a$), an axis of ordinates indicates temperatures of the radiating section, MCU, and the sealing material while an axis of abscissa indicates a length of an extent, over which the radiating section and the guide overlap each other. Also, the radiating section has a height of 50 mm.

In addition, the fan of a large air volume in the condition (e) is one used in industrial products and of a type used in that environment, in which sound emitted from the cooling fan is loud but causes no problem in spite of its loudness.

Also, simulation in FIG. 4($b$) is the same in FIG. 4($a$) except that a cooling fan used in the condition (e) is of a type generally called a calm type.

The calm type fan is one used in offices and household, and one of a type used in the case where calm is necessary because problems accompanied by unpleasantness for human sense of hearing are caused when a cooling fan emits a large sound.

Figure 4A:
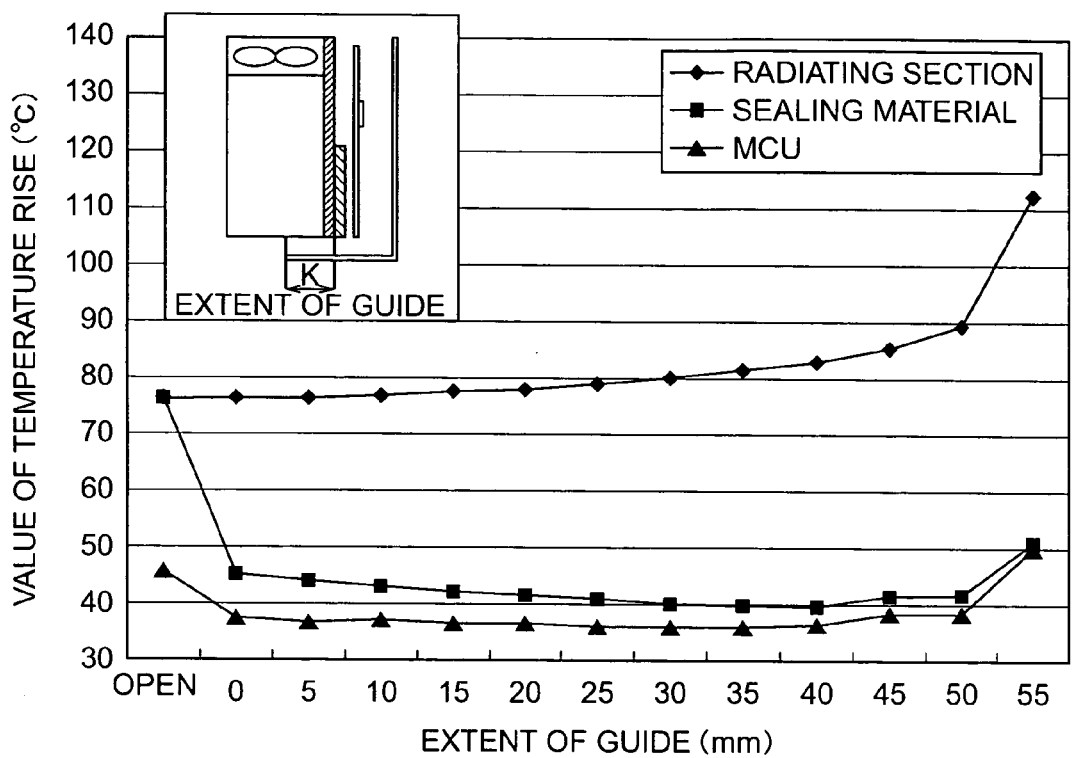
FIGS. 4(a) and 4(b) are views indicating characteristics obtained by simulation, FIG. 4(a) being a view indicating characteristics obtained by simulation, in which a cooling fan of a large air volume type is used and an extent is varied, over which the fan and the guide overlap each other, and FIG. 4(b) being a view indicating characteristics obtained by simulation, in which a cooling fan of a calm type is used and an extents is varied.
Figure 4B:
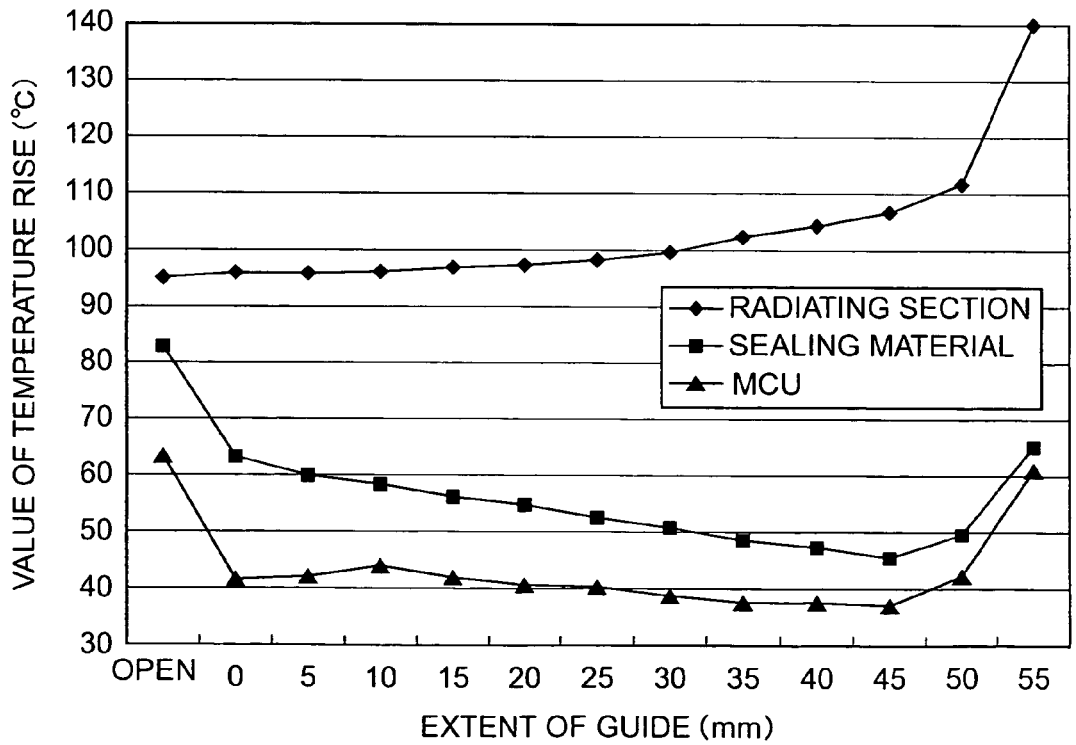

It is seen from FIGS. 4(a) and 4(b) that the sealing material is decreased in temperature only by providing the guide, and it is indicated in the figures that the sealing material is decreased until a length of an extent, over which the radiating section and the guide overlap each other, is increased up to substantially the same as a length of the radiating section. When a length of the guide becomes larger than that of the radiating section, however, all of the sealing material, the radiating section, and MCU are raised in temperature. From this, it is seen that making a length of the guide larger than that of the radiating section is ineffective in temperature rise.

Accordingly, it is seen from these results that in order to decrease temperature rise in the sealing material, a length of an extent, over which the radiating section and the guide overlap each other, should first be made at most substantially the same as a length of the radiating section. Accordingly, a length K of an extent of the guide relative to a height of the radiating section is represented by the following Formula 1.

$$K \leq H \qquad \text{(Formula 1)}$$

where H indicates a height of fins in the radiating section (a length up to a position, in which the fins 21 are mounted to the base 20: see FIG. 3).

Here, explained again, K indicates a length of an extent, over which the radiating section and the guide overlap each other, and represented differently, K indicates a length of an extent, over which the guide overlaps the radiating section.

In addition, the expression "OPEN" in FIG. 4(a) and FIG. 4(b) means that no guide is provided.

By the way, it is generally said that semiconductor devices are broken when temperature exceeds about 150° C. as described previously. In the light of this, in order to prevent temperatures of semiconductors mounted in the radiating section from exceeding 150° C., temperatures and conditions of an environment as used should be taken into consideration, but it can be said that it is preferable to prevent temperatures of the radiating section from exceeding 100° C.

From this, it is seen in FIG. 4(b) that an extent of the guide must be made at most 30 mm in order to prevent temperatures of the radiating section from exceeding 100° C. This is generalized to express the following Formula 2.

$$K \leq H*(3/5) \qquad \text{(Formula 2)}$$

Further, since wind flows in opposition to wind flowing in natural convection, the MCU on the substrate arranged in a region on the lee of the wind in conventional devices is not influenced by heat radiated from the sealing material, and so temperature rise indicates that the MCU is decreased in temperature until lengths of the radiating section and the guide reaches substantially a length of the cooling fan as on the sealing material.

Figure 5:
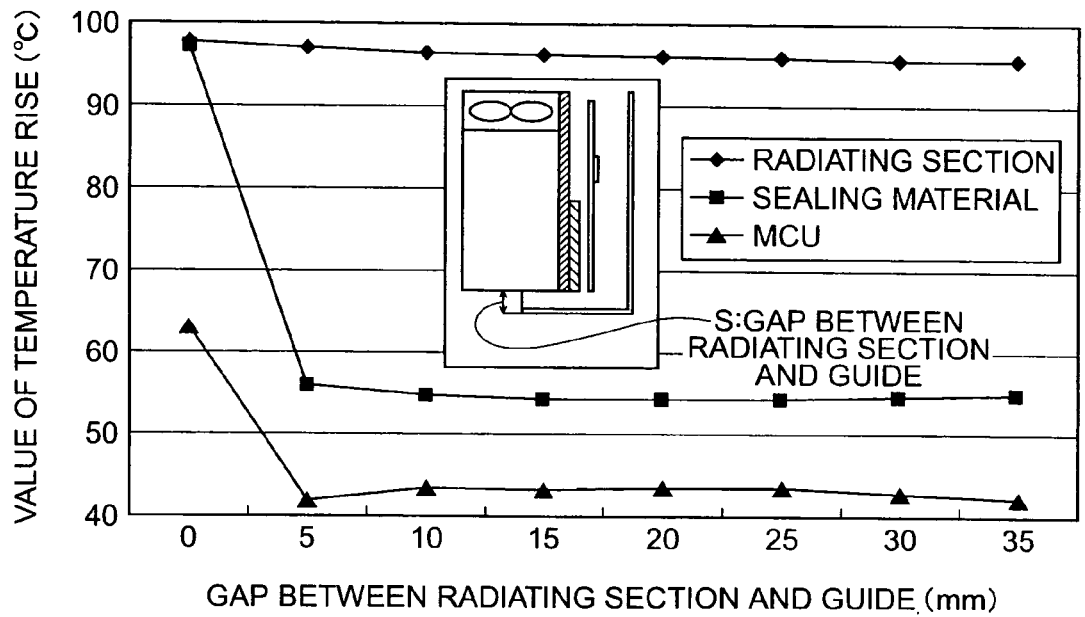
FIG. 5 is a view indicating characteristics obtained by simulation, in which a cooling fan of a calm type is used and a gap between the cooling fan and the guide is varied in magnitude.
Figure 6:
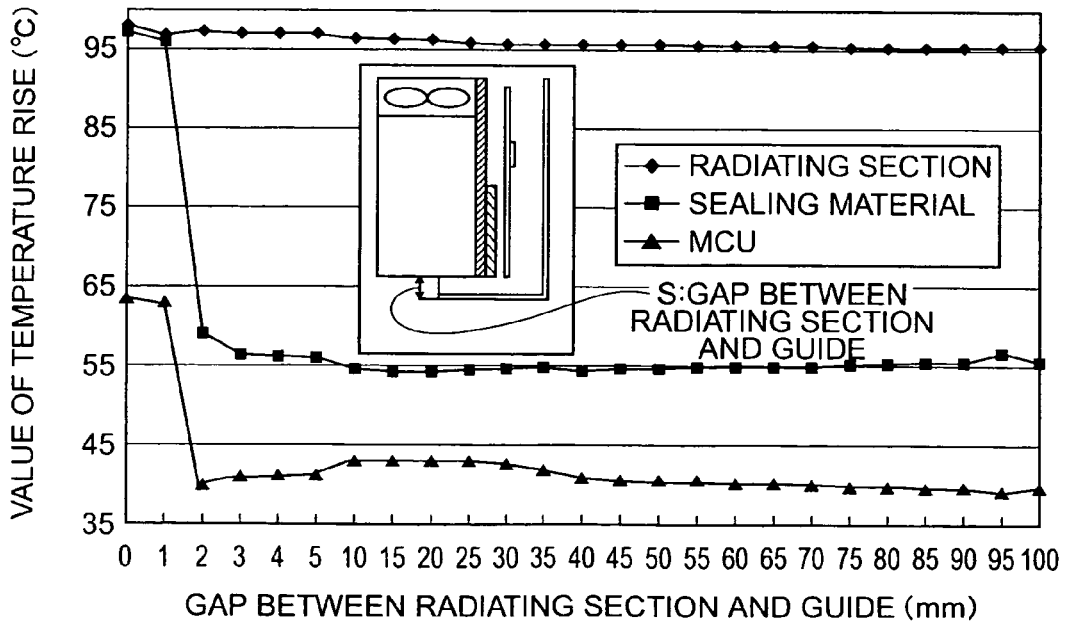
FIG. 6 is a view indicating characteristics obtained by a further simulation, in which a cooling fan of a calm type is used and a gap between the cooling fan and the guide is varied in magnitude.

Next, FIGS. 5 and 6 show results of a further simulation. In the simulation shown in FIGS. 5 and 6, conditions of simulation are changed from those shown in FIG. 4 in the following manner. The remainder is the same as those in FIG. 4.

(c) Simulation is carried out varying a magnitude of a gap between the radiating section and the guide.

(d) An length of an extent, over which the radiating section and the guide overlap each other, is made constant to amount to 15 mm.

(e) A cooling fan as used is of a type generally called a calm type.

In FIGS. 5 and 6, an axis of ordinates indicates temperatures of the radiating section, MCU, and the sealing material while an axis of abscissa indicates a magnitude of a gap between the radiating section and the guide.

It is seen from FIG. 5 that the sealing material and the MCU are decreased in temperature only by providing a gap between the radiating section and the guide and that when the gap is made 5 to 10 mm or larger in magnitude, the effect of reduction in temperature rise of the sealing material and the MCU does not change much.

Further, it is seen that even when a gap between the radiating section and the guide is varied in magnitude, the radiating section is susceptible to less change and that the provision of the guide does not give rise to reduction in radiation effect of the radiating section.

While preserving the essential radiating function of the radiating section owing to the fan and obtaining the effect of radiation on the substrate involving generation of much heat and the substrate involving generation of relatively less heat, an extent, over which the guide overlaps the radiating section, is limited in area with a view to avoiding scaling up of the device. Also, the gap should not be made large freely but it can be said that the gap is preferable in the order of 10 mm.

Meanwhile, it is seen with reference to FIG. 6 that the effect of radiation is had when a gap between the radiating section and the guide assumes a value of about 2 mm or more. Accordingly, it can be said that it is necessary to make a gap between the radiating section and the guide at least about 2 mm.

Further, FIG. 7 indicates a comparison in measurement on a conventional device and a device based on the embodiment. Measurement was carried out with a magnitude of the guide in the embodiment being 10 mm and a distance to the guide being 10 mm. It has been confirmed from results of the measurement that while temperature rise in the radiating section was suppressed, reduction in temperature rise was effected such that the sealing material was decreased 9.5° C. and the MCU was decreased 14.9° C. relative to that in the conventional device. Since the MCU mounts thereon semiconductor devices, such as CPU, etc., having a comparatively low performance guaranteed temperature, such reduction in temperature rise can contribute to stable control of the device, or the like.

The reason why the MCU is sharply reduced in temperature rise is that the following actions are thought to be obtained owing to the provision of the guide.

(a) The sealing material was reduced in temperature rise by forced cooling on the sealing material that constituted a heat source.

(b) Gases warmed by the sealing material were not directed toward the MCU.

(c) Forced cooling on the MCU was also performed to decrease the MCU in temperature rise.

The embodiment achieves these effects only by providing the guide.

Figure 8:
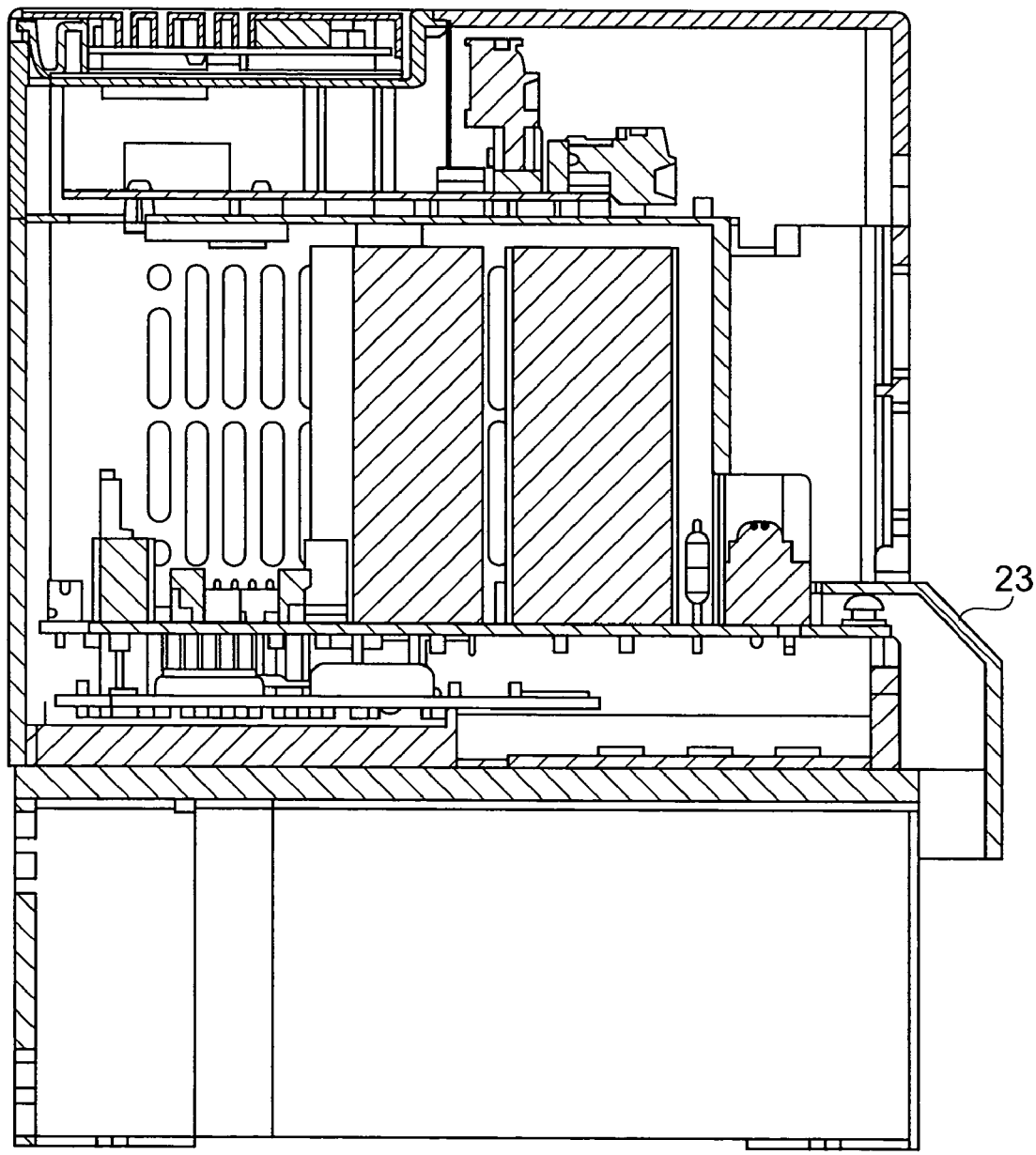
FIG. 8 is a view showing a further embodiment of the invention.

FIG. 8 shows a further embodiment.

The embodiment shown in FIG. 8 is the same as that shown in FIG. 2 but differs therefrom in that an incline 23 is provided on a guide 19 so that gases from the sealing material, a semiconductor such as MCU, etc. are made liable to flow into the intake face. Accordingly, the incline 23 may be curved so that flowing is made easy in accordance with the flow of a fluid, etc.

By establishing an appropriate extent, over which the radiating section and the guide overlap, and a distance between the radiating section and the guide as in the embodiment, the housing is made optimum in size and temperature rise inside the housing can be prevented even when a further device for promotion of cooling is not mounted.

Accordingly, the embodiment is specifically suitable for a device, in which a cooling fan cannot be arranged, as in a small-sized device, and it is possible to produce a useful effect of reduction in temperature rise.

In addition, the embodiment has been described on the basis of a frequency converter. However, such embodiment is not limitative. The invention is useful in mounting a device comprising semiconductor devices, modules, substrates, etc., which operate to thereby generate a large quantity of heat as compared with semiconductor devices, modules, substrates, etc., which generate a small quantity of heat.

In this case, according to the embodiment of the invention, semiconductor devices, modules, substrates, etc., which generate a small quantity of heat, are mounted on a first substrate while semiconductor devices, modules, substrates, etc., which generate a large quantity of heat, are mounted on a second substrate. Then, the first substrate is fixed in a position distant a predetermined length from the second substrate. Thus, heat from semiconductor devices, etc., which generate a large quantity of heat, can be prevented from being conducted to semiconductor devices, etc. mounted on the first substrate.

Subsequently, the second substrate is fixed to the radiating section provided with fins, and forced cooling on the radiating section with a fan causes heat emitted from the second substrate to be radiated.

Further, a guide, by which gases around the first substrate and the second substrate are caused to flow toward the intake face of the radiating section, is provided on the housing. When the fan is operated, the guide affords forced cooling on the first substrate and the second substrate. As a result, temperature rise in the first substrate, the second substrate, and the housing can be reduced without the provision of an additional fan. In addition, the second substrate is arranged in a manner to be disposed on the lee of the first substrate at the time of forced cooling.

By mounting control elements, such as semiconductors, CPU, etc., having a comparatively low performance guaranteed temperature on the first substrate, it becomes possible to produce a further effect of reduction in temperature rise.

Here, an explanation will be again given to an action of the guide provided in the embodiments of the invention. With the embodiments, as shown in FIGS. 1, 2, 4, 5, 6, and 8, gases around the substrate 9, the substrate 11, etc. are exhausted by the fan. Owing to the action, gases having heat emitted from the substrate 9, the substrate 11, etc. are exhausted and heat can be radiated from these substrates. The guide 19 is provided in a position, in which a gas flow generated when the fan exhausts gases about the radiating section and a gas flow generated when gases around the substrate 9, the substrate 11, etc. are exhausted flow together at that time.

Assuming, for example, the case where the guide 19 shown in FIG. 1 is not provided, gases around the substrate 9, the substrate 11, etc. are hard to be entrained into that flow in a direction, in which is exhausted by the fan 5. While the fan 5 exhausts gases passing through the radiating section 4 to radiate heat therefrom, it is hard to have an influence on gases around the substrate 9, the substrate 11, etc.

On the other hand, in the case where the guide 19 shown in FIG. 1 is provided, gases around the substrate 9, the substrate 11, etc. can be sucked together when the fan 5 sucks gases from the intake face of the radiating section 4 and exhausts the gases from the exhaust face of the radiating section 4. This is attributable to an action of an extent, over which the guide 19 overlaps a part of the intake face of the radiating section 4.

While a configuration of the overlapping extent and a way to arrange the same have been described in the embodiment, they are not limitative but the embodiment may be suitably modified provided that gases around the substrate 9, the substrate 11, etc. are sucked and exhausted by the fan 5. In addition, for the overlapping extent, magnitudes of spaces, in which gases around the substrate 9, the substrate 11, etc. flow, and a magnitude of an area, in which the guide overlaps the exhaust face of the radiating section 4, may be set referring to results of simulation indicated in FIGS. 4, 5, and 6, etc.

According to the embodiments of the invention, it is possible to achieve an improvement in measures to reduce temperature rise in electronic parts arranged inside the device, or in the radiating section. Also, it is also possible to achieve miniaturization of the device.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A frequency converter comprising a circuit substrate,
   a housing that covers at least the circuit substrate,
   a radiating section that sucks gases from an intake face to suck gases and exhausts gases from an exhaust face to exhaust gases, thus radiating heat, and
   a fan provided on the exhaust face of the radiating section, wherein
   a guide provided on the housing to direct gases around the circuit substrate toward the intake face.

2. The frequency converter according to claim 1, wherein an extent, over which the guide overlaps the radiating section, has a length K that is prescribed by the following relationship $$K \leq H$$

where H indicates a height of fins provided in the radiating section, or a length of the fins up to a position, in which the fins are mounted to the radiating section.

3. The frequency converter according to claim 1, wherein an extent, over which the guide overlaps the radiating section, has a length K that is prescribed by the following relationship $$K \leq H*(3/5)$$

where H indicates a height of fins provided in the radiating section, or a length of the fins up to a position, in which the fins are mounted to the radiating section.

4. The frequency converter according to claim 1, wherein a magnitude of a gap between the guide and the radiating section is 2 mm or larger.

5. The frequency converter according to claim 1, wherein gases in contact with the power conversion circuit substrate are conducted from the guide to the intake face of the radiating section.

6. A frequency converter comprising a first substrate and a second substrate,
 a housing that covers at least the first substrate and the second substrate,
 a radiating section, in which gases sucked from an intake face are exhausted from an exhaust face to radiate heat, and
 a fan provided on the exhaust face of the radiating section to cause gases, from which heat is to be radiated, to pass through the radiating section to be exhausted from the exhaust face, wherein
 a guide provided on the housing to cause gases in contact with the first substrate or the second substrate to be conducted to the intake face.

7. The frequency converter according to claim 6, wherein the second substrate is arranged in a position nearer to the intake face of the radiating section than the first substrate.

8. The frequency converter according to claim 6, wherein the first substrate is lower in performance guaranteed temperature than the second substrate, and
 the second substrate is one that operates to thereby generate a larger quantity of heat than the first substrate does.

9. The frequency converter according to claim 6, wherein the first substrate is one having a control circuit that controls the frequency converter, and
 the second substrate is one having a circuit for conversion of power.

10. The frequency converter according to claim 6, wherein the second substrate is fixed to be in contact with the radiating section, and
 the first substrate is provided in a position distant a predetermined length from the second substrate.

* * * * *